(12) United States Patent
Kobayashi et al.

(10) Patent No.: US 11,111,577 B2
(45) Date of Patent: Sep. 7, 2021

(54) FILM-FORMING APPARATUS AND FILM-FORMING METHOD

(71) Applicant: ULVAC, Inc., Chigasaki (JP)

(72) Inventors: Yousuke Kobayashi, Chigasaki (JP); Harunori Iwai, Chigasaki (JP); Tetsushi Fujinaga, Chigasaki (JP); Atsuhito Ihori, Chigasaki (JP); Noriaki Tani, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 214 days.

(21) Appl. No.: 15/757,820

(22) PCT Filed: Feb. 27, 2017

(86) PCT No.: PCT/JP2017/007576
§ 371 (c)(1),
(2) Date: Mar. 6, 2018

(87) PCT Pub. No.: WO2017/169448
PCT Pub. Date: Oct. 5, 2017

(65) Prior Publication Data
US 2018/0355474 A1 Dec. 13, 2018

(30) Foreign Application Priority Data
Mar. 29, 2016 (JP) .............................. JP2016-065360

(51) Int. Cl.
*C23C 14/35* (2006.01)
*H01F 41/18* (2006.01)
(Continued)

(52) U.S. Cl.
CPC .............. *C23C 14/35* (2013.01); *C23C 14/06* (2013.01); *C23C 14/3407* (2013.01);
(Continued)

(58) Field of Classification Search
CPC .......................... H01J 37/3452; H01J 37/3455
See application file for complete search history.

(56) References Cited

U.S. PATENT DOCUMENTS 5,006,219 A * 4/1991 Latz ................... H01J 37/32192
204/192.12
5,795,448 A * 8/1998 Hurwitt ............... H01L 21/6715
118/729
(Continued)

FOREIGN PATENT DOCUMENTS

| CN | 101680079 | 3/2010 |
| CN | 102719798 A | 10/2012 |

(Continued)

OTHER PUBLICATIONS

International Application Serial No. PCT/JP2017/007576, International Preliminary Report on Patentability dated May 16, 2017, 5 pgs.

(Continued)

*Primary Examiner* — Jason Berman
(74) *Attorney, Agent, or Firm* — Schwegman Lundberg & Woessner, P.A.

(57) ABSTRACT

A film formation apparatus includes a target containing a magnetic material, a support that supports a substrate and locates the substrate in an arrangement region opposing the target, and a magnetic field formation unit located at a side of the arrangement region opposite to the target. The magnetic field formation unit forms a horizontal magnetic field parallel to an oscillation direction, which is one direction extending along the substrate, at a side of the arrangement region where the target is located. The magnetic field formation unit oscillates the horizontal magnetic field in the oscillation direction at least between one end of the arrangement region and another end of the arrangement region in the oscillation direction.

6 Claims, 4 Drawing Sheets

(51) Int. Cl.
*C23C 14/34* (2006.01)
*H01J 37/34* (2006.01)
*C23C 14/06* (2006.01)

(52) U.S. Cl.
CPC ........... *C23C 14/351* (2013.01); *H01F 41/18* (2013.01); *H01J 37/3405* (2013.01); *H01J 37/3408* (2013.01); *H01J 37/3426* (2013.01); *H01J 37/3452* (2013.01); *H01J 37/3455* (2013.01)

(56) References Cited

U.S. PATENT DOCUMENTS

| | | | |
|---|---|---|---|
| 5,833,815 A * | 11/1998 | Kim | ........................ C23C 14/35 204/192.12 |
| 6,036,825 A | 3/2000 | Umetsu et al. | |
| 2003/0230482 A1* | 12/2003 | Teng | ........................ C23C 14/35 204/298.2 |
| 2010/0187100 A1 | 7/2010 | Takahashi et al. | |
| 2011/0303527 A1 | 12/2011 | Hosoya et al. | |
| 2013/0319855 A1* | 12/2013 | Li | ........................ H01J 37/3266 204/298.11 |

FOREIGN PATENT DOCUMENTS

| | | | | |
|---|---|---|---|---|
| JP | 61288067 | A * | 6/1988 | .......... H01J 37/3408 |
| JP | H05339727 | | 12/1993 | |
| JP | H0718435 | | 1/1995 | |
| JP | H09228041 | | 9/1997 | |
| JP | H11229139 | | 8/1999 | |
| JP | H11329837 | | 11/1999 | |
| TW | 201348486 | A | 12/2013 | |
| WO | WO-2010100710 | | 9/2012 | |
| WO | WO-2017169448 | | 10/2017 | |

OTHER PUBLICATIONS

"International Application No. PCT/JP2017/007576, International Search Report and Written Opinion dated May 16, 2017", (dated May 16, 2017), 8 pgs.

"Chinese Patent Application Serial No. 201780003366.6, First Office Action dated May 29, 2019", with English Translation, 12 pgs.

Taiwan Application Serial No. TW106107524A, Office Action dated Mar. 5, 2020, 11 pgs.

* cited by examiner

FILM-FORMING APPARATUS AND FILM-FORMING METHOD

PRIORITY CLAIM TO RELATED APPLICATIONS

This application is a U.S. national stage filing under 35 U.S.C. § 371 from International Application No. PCT/JP2017/007576, filed on 27 Feb. 2017, and published as WO2017/169448 on 5 Oct. 2017, which claims the benefit under 35 U.S.C. 119 to Japanese Application No. 2016-065360, filed on 29 Mar. 2016; the benefit of priority of each of which is claimed herein, and which applications and publication are hereby incorporated herein by reference in their entirety.

TECHNICAL FIELD

The present invention relates to a film formation apparatus that forms a magnetic film containing a magnetic material and a film formation method for forming a magnetic film.

BACKGROUND ART

A known film formation apparatus that forms a magnetic film containing a magnetic material includes a target that contains a magnetic material, a support that supports a substrate at a position opposed to the target in a chamber, and an electrode that is provided with a magnetic circuit and located at the side of the target opposite to the support. The film formation apparatus sputters the target by applying voltage to the electrode in a state in which the chamber is supplied with sputter gas. This forms a magnetic film on the surface of the substrate that is opposed to the target (for example, refer to patent document 1).

Patent Document 1: Japanese Laid-Open Patent Publication No. 11-329837

SUMMARY OF THE INVENTION

A known magnetic film has magnetic anisotropy that is one of the characteristics of a magnetic film. There is a demand for such a magnetic film to have higher magnetic anisotropy. Accordingly, there is a demand for a film formation apparatus that can increase the magnetic anisotropy of a magnetic film.

It is an object of the present invention to provide a film formation apparatus and a film formation method that are able to increase the magnetic anisotropy of a magnetic film.

One aspect of the present invention is a film formation apparatus. The film formation apparatus includes a target, a support, and a magnetic field formation unit. The target contains a magnetic material. The support supports a substrate and locates the substrate in an arrangement region opposing the target. The magnetic field formation unit is located at a side of the arrangement region opposite to the target. The magnetic field formation unit forms a horizontal magnetic field parallel to an oscillation direction, which is one direction extending along the substrate, at a side of the arrangement region where the target is located. The magnetic field formation unit oscillates the horizontal magnetic field in the oscillation direction at least between one end of the arrangement region and another end of the arrangement region in the oscillation direction.

A further aspect of the present invention is a film formation method. The film formation method includes sputtering a target that contains magnetic material and forming a horizontal magnetic field parallel to an oscillation direction, which is one direction extending along a substrate opposing the target, on the substrate at a side where the target is located so that the horizontal magnetic field oscillates at least between one end of the substrate and another end of the substrate in the oscillation direction while the target is being sputtered.

With the above structure and the above method, the horizontal magnetic field having a predetermined strength scans an in-plane of the substrate in the oscillation direction. Thus, when a magnetic film is formed on the substrate, differences in the strength of the horizontal magnetic field are obviated from becoming uniform in the plane of the substrate S. Further, differences in the strength of the horizontal magnetic field are limited when each portion of the magnetic film is formed. This increases the magnetic anisotropy of the magnetic film.

In the film formation apparatus, the magnetic field formation unit is a first magnetic field formation unit, and the film formation apparatus further includes a second magnetic field formation unit located at a side of the target opposite to the support. The second magnetic field formation unit oscillates in the oscillation direction between one end of the target and another end of the target in the oscillation direction and forms a magnetic field at a side of the target where the support is located. Preferably, the first magnetic field formation unit synchronizes oscillation of the magnetic field formed by the second magnetic field formation unit and oscillation of the horizontal magnetic field formed by the first magnetic field formation unit.

With the above structure, the oscillation of the horizontal magnetic field formed by the first magnetic field formation unit is oscillated with the magnetic field formed by the second magnetic field formation unit. This regularly changes the position of the horizontal magnetic field formed by the first magnetic field formation unit and the position of a high plasma density region formed by the second magnetic field formation unit. Thus, the relationship of the density of the sputtering grains flying toward the substrate and the strength the horizontal magnetic field acting at the position hit by the sputtering grains is maintained in a predetermined state by the synchronized oscillation of the first and second magnetic field formation units. This limits differences in the strength of the horizontal magnetic field HM produced in the plane of the substrate S when the magnetic film is formed.

In the film formation apparatus, the first magnetic field formation unit preferably includes a first magnetic circuit that forms the horizontal magnetic field, the second magnetic field formation unit includes a second magnetic circuit that forms the magnetic field, and the first magnetic field formation unit oscillates the first magnetic circuit so that the first magnetic circuit and the second magnetic circuit are opposed sandwiching the target and the arrangement region.

With the above structure, the high plasma density region formed by the second magnetic field formation unit and the region where the horizontal magnetic field is formed by the first magnetic field formation unit are overlapped in a direction in which the target 31 and the substrate are opposed. Thus, the first magnetic field formation unit forms the horizontal magnetic field on the substrate at a position in the oscillation direction where the density of the sputtering grains released from the target is high. Accordingly, the horizontal magnetic field formed by the first magnetic field formation unit acts on many portions of the magnetic film formed on the substrate. This limits differences in the strength of the horizontal magnetic field produced in the plane of the substrate when the magnetic film is formed.

In the film formation apparatus, the target has a width in the oscillation direction as a target width. The arrangement region has a width in the oscillation direction as an arrangement width. The arrangement width is smaller than the target width, and the two ends of the arrangement region are located inward from the ends of the target in the oscillation direction. A range in which the first magnetic circuit moves in the oscillation direction with respect to one dimensional coordinates includes a range sandwiched by a position at the one end of the target and a position at the other end of the target.

In the oscillation direction, the two ends of the range in which the first magnetic circuit moves is where the movement speed of the first magnetic circuit is often decreased or increased. Thus, the magnetic film formed when the first magnetic circuit is moving at a constant speed and the magnetic film formed when the first magnetic circuit is decelerating or accelerating may differ in the strength of the horizontal magnetic field acting on the substrate per unit distance and thus may have different magnetic film characteristics.

In this regard, with the above structure, the first magnetic circuit moves to positions beyond the two ends of the arrangement region in the oscillation direction. This limits the formation of portions where the strength of the horizontal magnetic field per unit distance in the oscillation direction differs from that of other portions in the substrate because of the deceleration and acceleration of the first magnetic circuit. Accordingly, differences are limited in the strength of the horizontal magnetic field produced in the plane of the substrate when the magnetic film is formed. As a result, the magnetic anisotropy in the magnetic film is easily increased.

In the film formation apparatus, preferably, the first magnetic field formation unit includes permanent magnets that are configured by a pair of permanent magnets, each of the permanent magnets is pillar-shaped and extends in a direction intersecting the oscillation direction, each of the permanent magnets includes an end opposing the arrangement region as a distal end, and a magnetic pole at the distal end of one of the permanent magnets and a magnetic pole at the distal end of the other one of the permanent magnets are different magnetic poles.

With the above structure, the permanent magnets included in the first magnetic field formation unit are formed by a pair of permanent magnets. Thus, the horizontal magnetic field formed between the two permanent magnets scans the entire substrate. Accordingly, in comparison with a structure in which a magnet circuit including multiple pairs of permanent magnets scans the substrate, the difference in magnetic field direction, between the magnetic fields formed by the pairs of permanent magnets, and the distribution of the magnetic field strength are limited. This further reduces differences in the magnetic field strength in the plane of the substrate S. As a result, the magnetic anisotropy of the magnetic film is further increased.

DETAILED DESCRIPTION

With reference to FIGS. 1 to 8, one embodiment of a film formation apparatus and a film formation method will be described. The structure of the film formation apparatus, the structure of a film formation chamber, and the film formation method will be described in order hereafter.

[Structure of Film Formation Apparatus]

The structure of the film formation apparatus will now be described with reference to FIG. 1.

Figure 1:
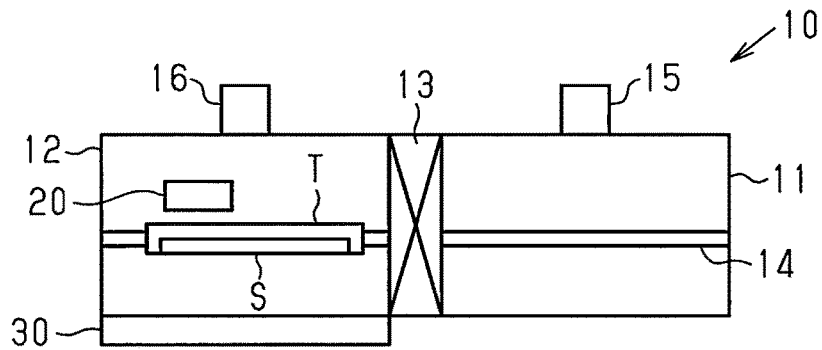
FIG. 1 is a block diagram showing one embodiment of a film formation apparatus according to the present invention together with a substrate in a top view.

As shown in FIG. 1, a film formation apparatus 10 includes a load lock chamber 11 and a film formation chamber 12 that are arranged next to each other in a coupling direction, which is one direction. A gate valve 13 is located between the load lock chamber 11 and the film formation chamber 12. When the gate valve 13 opens, the load lock chamber 11 and the film formation chamber 12 are connected. When the gate valve 13 closes, the load lock chamber 11 and the film formation chamber 12 are disconnected.

The processing subject of the film formation apparatus 10 is a substrate S. The substrate S is loaded into the film formation apparatus 10 in a state mounted on a tray T, which supports the substrate S. The material forming the substrate S is, for example, glass or resin. The material forming the tray T is, for example, metal.

The film formation apparatus 10 includes a transportation unit 14. The transportation unit 14 extends in the coupling direction from the load lock chamber 11 to the film formation chamber 12. Further, the transportation unit 14 transports the substrate S in the coupling direction in a state mounted on the tray T through the load lock chamber 11 and the film formation chamber 12. The transportation unit 14 can support the substrate S at a predetermined location in the film formation chamber 12. The transportation unit 14 is one example of a support. The transportation unit 14 supports the substrate S so that the surface subject to processing is substantially orthogonal to the horizontal direction. That is, the transportation unit 14 transports the substrate S held in an upright state.

The load lock chamber 11 includes an exhaust unit 15. The exhaust unit 15 reduces the pressure of the load lock chamber 11 to a predetermined pressure. A pre-processed substrate S is loaded from outside into the film formation apparatus 10 through the load lock chamber 11. A post-processed substrate S is unloaded from the film formation apparatus 10 through the load lock chamber 11.

The film formation chamber 12 includes an exhaust unit 16, a first magnetic field formation unit 20, and a cathode 30.

The exhaust unit 16 reduces the pressure of the film formation chamber 12 to a predetermined pressure in the same manner as the exhaust unit 15 of the load lock chamber 11. The transportation unit 14 arranges the substrate S at a position opposing the cathode 30 inside the film formation chamber 12. The film formation chamber 12 performs a film formation process, which is a process for forming a magnetic film, on the substrate S, which is positioned by the transportation unit 14.

The film formation apparatus 10 loads a pre-processed substrate S from outside the film formation apparatus 10 into the film formation apparatus 10 through the load lock chamber 11, and the transportation unit 14 transports the substrate S from the load lock chamber 11 to the film formation chamber 12. Then, a film formation process is performed on the substrate S in the film formation chamber 12, and the transportation unit 14 transports the post-processed substrate S from the film formation chamber 12 toward the load lock chamber 11. The film formation apparatus 10 unloads the post-processed substrate S from the film formation apparatus 10 through the load lock chamber 11.

The film formation apparatus 10 need only include the film formation chamber 12 and does not have to include the load lock chamber 11. Alternatively, in addition to the load lock chamber 11 and the film formation chamber 12, the film formation apparatus 10 may include a chamber that performs a predetermined process on the substrate S before the film formation chamber 12 or a chamber that performs a predetermined process on the substrate S after the film formation chamber 12.

[Structure of Film Formation Chamber]

The structure of the film formation chamber will now be described with reference to FIGS. 2 to 7.

Figure 2:
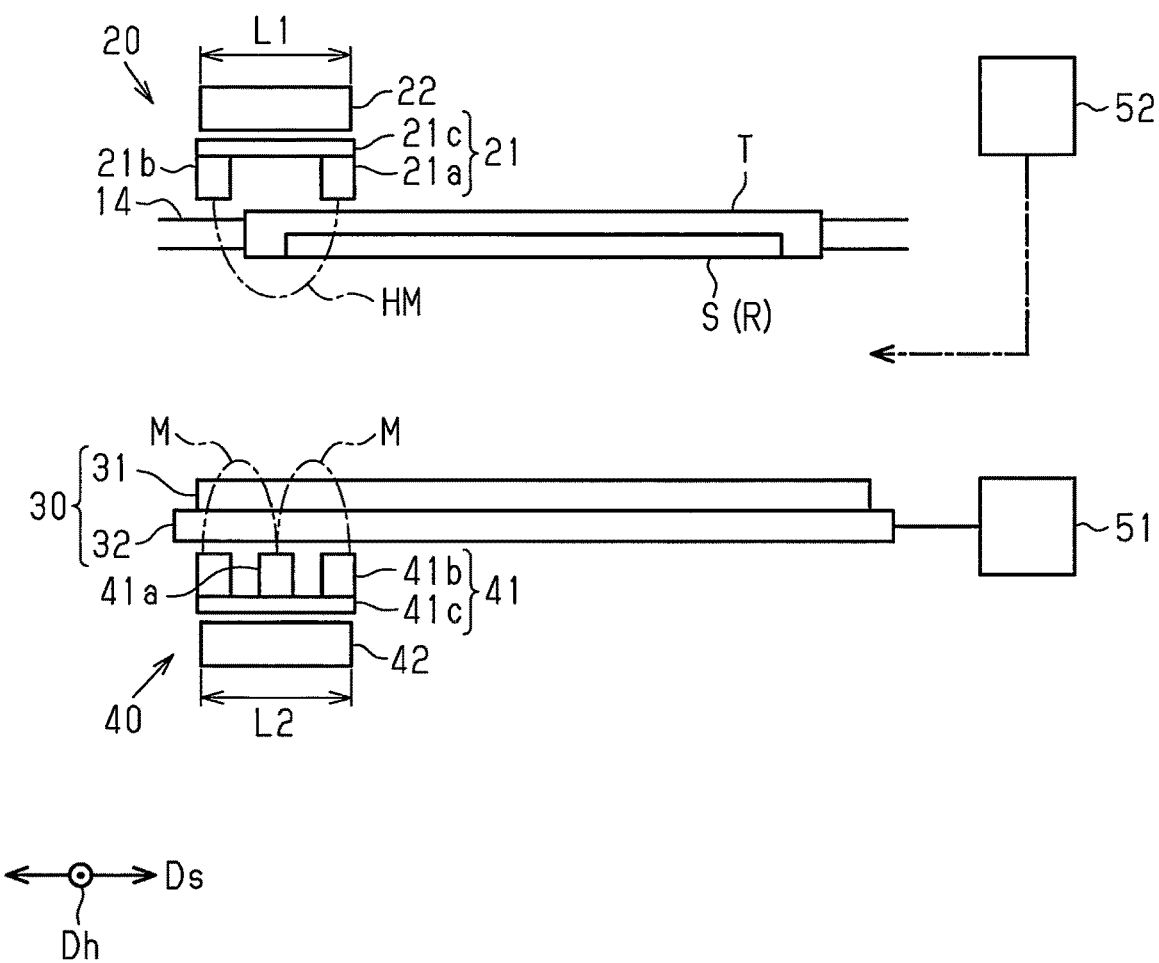
FIG. 2 is a block diagram showing a film formation chamber together with the substrate in a top view.

As shown in FIG. 2, the film formation chamber 12 includes a target 31, the transportation unit 14, and the first magnetic field formation unit 20. The target 31 contains a magnetic material, and the transportation unit 14 supports the substrate S so that the substrate S is located in an arrangement region R opposed to the target 31.

In other words, the transportation unit 14 supports the substrate S opposing the target 31. The transportation unit 14 supports the substrate S in a state substantially parallel to the direction of a normal to a plane of the substrate S that opposes the target 31 and the direction of a normal to a plane of the target 31 that opposes the substrate S.

The first magnetic field formation unit 20 is located on the side of the arrangement region R opposite to the target 31. The first magnetic field formation unit 20 forms a horizontal magnetic field HM parallel to an oscillation direction Ds that is one direction in which the substrate S at the side of the arrangement region R where the target 31 is located. In other words, the first magnetic field formation unit 20 forms the horizontal magnetic field HM, which is parallel to the oscillation direction Ds, on the surface of the substrate S that opposes the target 31.

The first magnetic field formation unit 20 oscillates the horizontal magnetic field HM in the oscillation direction Ds at least between one end and the other end of the arrangement region R in the oscillation direction Ds. In other words, the first magnetic field formation unit 20 is located at the side of the substrate S opposite to the target 31 and oscillates the horizontal magnetic field HM in the oscillation direction Ds at least between one end and the other end of the substrate S in the oscillation direction Ds.

In the film formation chamber 12, the horizontal magnetic field HM that has a predetermined strength scans a plane of the substrate S in the oscillation direction Ds. Thus, when a magnetic film is formed on the substrate S, differences in the strength of the horizontal magnetic field HM are obviated from becoming uniform in the plane of the substrate S. Further, differences in the strength of the horizontal magnetic field HM are limited when each portion of the magnetic film is formed. This increases the magnetic anisotropy of the magnetic film.

The first magnetic field formation unit 20 includes a first magnetic circuit 21 and a first oscillation unit 22. The first magnetic circuit 21 forms the horizontal magnetic field HM, and the first oscillation unit 22 oscillates the first magnetic circuit 21 in the oscillation direction Ds.

The first magnetic circuit 21 includes two permanent magnets, namely, a first magnet 21a and a second magnet 21b. In other words, the permanent magnets included in the first magnetic circuit 21 are formed by a pair of permanent magnets. A direction intersecting the oscillation direction Ds is a height-wise direction Dh. Each permanent magnet is pillar-shaped and extends in the height-wise direction Dh. In each permanent magnet, the end that opposes the arrangement region R is a distal end. The magnetic pole at the distal end of one of the permanent magnets, namely, the first magnet 21a is a magnetic pole that differs from the magnetic pole at the distal end of the other one of the permanent magnets, namely, the second magnet 21b.

The first magnetic circuit 21 includes a pair of permanent magnets. Thus, the horizontal magnetic field HM formed between the two permanent magnets scans the entire substrate S. Accordingly, in comparison with a structure in which a magnet circuit including multiple pairs of permanent magnets scans the substrate S, the difference in magnetic field direction, between the magnetic fields formed by the pairs of permanent magnets, and the distribution of the magnetic field strength are limited. This further reduces differences in the magnetic field strength in the plane of the substrate S. As a result, the magnetic anisotropy of the magnetic film is further increased.

It is only required that the magnetic pole at the distal end of the first magnet 21a differ from the magnetic pole at the distal end of the second magnet 21b. Thus, the distal end of the first magnet 21a may be an N-pole, and the distal end of the second magnet 21b may be the S-pole. Alternatively, the distal end of the first magnet 21a may be the S-pole, and the distal end of the second magnet 21b may be the N-pole.

The first magnetic circuit 21 further includes a yoke 21c. The first magnet 21a and the second magnet 21b are fixed to the yoke 21c arranged next to each other in the oscillation direction Ds.

In a structure in which a first magnetic circuit forms a horizontal magnetic field in a direction orthogonal to the oscillation direction Ds, in order to apply the horizontal magnetic field to the entire substrate S, the distance between a first magnet and a second magnet in the height-wise direction Dh needs to be substantially equal to the distance between one end and the other end of the substrate S. In other words, the distance between the first magnet and the second magnet in the height-wise direction Dh needs to be about the same as the size of the substrate S.

In this respect, with the first magnetic circuit 21 that forms the horizontal magnetic field HM with the first magnet 21a and the second magnet 21b parallel to the oscillation direction Ds, the size of the substrate S does not impose any limitation on the distance between the first magnet 21a and the second magnet 21b. This allows for reduction in the distance between the first magnet 21a and the second magnet 21b. Consequently, differences are limited in the strength of the horizontal magnetic field HM applied to the substrate S in the plane of the substrate S.

The width of the first magnetic circuit 21 in the oscillation direction Ds is a first width L1. The first width L1 is the distance between the surface of the first magnet 21a at the side opposite to the surface opposing the second magnet 21b and the surface of the second magnet 21b at the side opposite to the surface opposing the first magnet 21a.

The magnetic flux density of the first magnetic circuit 21 on the surface of the substrate S opposing the target 31 is preferably 1 G or greater and further preferably 10 G or greater. If the magnetic flux density is 1 G or greater, in comparison with a magnetic film formed in a state in which a magnetic field is not applied, the magnetic anisotropy of the magnetic film is increased when formed in a state in which the horizontal magnetic field HM is applied. If the magnetic flux density is 10 G or greater, the increasing of the magnetic anisotropy in the magnetic film is ensured.

The first oscillation unit 22 includes a power source that generates the power for oscillating the first magnetic circuit 21, a transmission that transmits the power to the first magnetic circuit 21, and a controller that controls and drives the power source. The controller outputs a control signal that controls and drives the power source, and the power source is driven in accordance with the control signal. The transmission includes, for example, a threaded shaft that extends in the oscillation direction Ds and a nut mated with the threaded shaft and fixed to the first magnetic circuit 21. The power source is, for example, a motor that rotates the threaded shaft. The motor rotates the threaded shaft in a first direction and a second direction, which is opposite to the first direction.

With the first oscillation unit 22, the motor rotates the threaded shaft in the first direction to move the first magnetic circuit 21 in the oscillation direction Ds. Further, the motor rotates the threaded shaft in the second direction to move the first magnetic circuit 21 in the oscillation direction Ds reversed from when the threaded shaft is rotated in the first direction.

The cathode 30 includes the target 31 and a backing plate 32. The target 31 contains a magnetic material as described above. The magnetic material is, for example, NiFe, CoFe, or CoFeB. Preferably, most of the target 31 is formed from a magnetic material. For example, 75 mass % or greater is a magnetic material.

The surface of the target 31 opposing the substrate S is sputtered to form a magnetic film containing magnetic material on the substrate S. The magnetic film has a magnetization easy axis that is a crystalline direction in which the magnetic film easily magnetizes. In comparison with when a magnetic field is applied in another direction, the magnetic film magnetizes more easily when a magnetic field parallel to the magnetization easy axis is applied. The magnetic film has a negative saturation magnetization and a positive saturation magnetization. Further, the magnetic anisotropy is increased as the difference decreases in the magnetic field required to reverse the magnetization of the magnetic film from negative saturation magnetization to positive saturation magnetization.

The backing plate 32 is fixed to the surface of the target 31 that is located at the side opposite to the surface opposing the arrangement region R. The material forming the backing plate 32 is a metal.

The film formation chamber 12 includes a second magnetic field formation unit 40. The second magnetic field formation unit 40 is located at the side of the target 31 opposite to the transportation unit 14. The second magnetic field formation unit 40 forms a magnetic field M at the side of the target 31 where the transportation unit 14 is located. In other words, the second magnetic field formation unit 40 forms the magnetic field M on the surface of the target 31 opposing the substrate S and located at the side opposite to the surface fixed to the backing plate 32. The second magnetic field formation unit 40 oscillates the magnetic field M in the oscillation direction Ds between one end and the other end of the target 31 in the oscillation direction Ds.

The second magnetic field formation unit 40 includes a second magnetic circuit 41 and a second oscillation unit 42. The second magnetic circuit 41 forms the magnetic field M, and the second oscillation unit 42 oscillates the second magnetic circuit 41 in the oscillation direction Ds.

The second magnetic circuit 41 includes two permanent magnets, namely, a first magnet 41a and a second magnet 41b, and a yoke 41c, to which the two permanent magnets are fixed. The first magnet 41a is pillar-shaped and extends in the height-wise direction Dh. The second magnet 41b is annular and extends in the height-wise direction Dh surrounding the first magnet 41a. The first magnet 41a and the second magnet 41b each have an end opposing the backing plate 32 as a distal end. The magnetic pole at the distal end of the first magnet 41a differs from the magnetic pole at the distal end of the second magnet 41b.

The width of the second magnetic circuit 41 in the oscillation direction Ds is a second width L2. The second width L2 is the distance between two portions of the second magnet 41b opposing each other in the oscillation direction Ds in the surface at the side opposite to the surface opposing the first magnet 41a. The first width L1 of the first magnetic circuit 21 is equal to, for example, the second width L2.

The magnetic flux density of the second magnetic circuit 41 at the surface of the target 31 opposing the arrangement region R is, for example, preferably 100 G or greater.

In the same manner as the first oscillation unit 22, the second oscillation unit 42 includes a power source that generates the power for oscillating the second magnetic circuit 41, a transmission that transmits the power to the second magnetic circuit 41, and a controller that controls and drives the power source. The controller outputs a control signal that controls and drives the power source, and the power source is driven in accordance with the control signal. The transmission includes, for example, a threaded shaft that extends in the oscillation direction Ds and a nut mated with the threaded shaft and fixed to the second magnetic circuit 41. The power source is, for example, a motor that rotates the threaded shaft. The motor rotates the threaded shaft in a first direction and a second direction, which is opposite to the first direction.

With the second oscillation unit 42, the motor rotates the threaded shaft in the first direction to move the second magnetic circuit 41 in the oscillation direction Ds. Further, the motor rotates the threaded shaft in the second direction to move the second magnetic circuit in the oscillation direction Ds reversed from when the threaded shaft is rotated in the first direction.

The film formation chamber 12 further includes an electric power supply 51 and a gas supply unit 52. The electric power supply 51 is connected to the backing plate 32. When the target 31 is sputtered, the electric power supply 51 applies voltage via the backing plate 32 to the target 31. The gas supply unit 52 supplies, for example, sputter gas such as noble gas to the inside of the film formation chamber 12.

Figure 3:
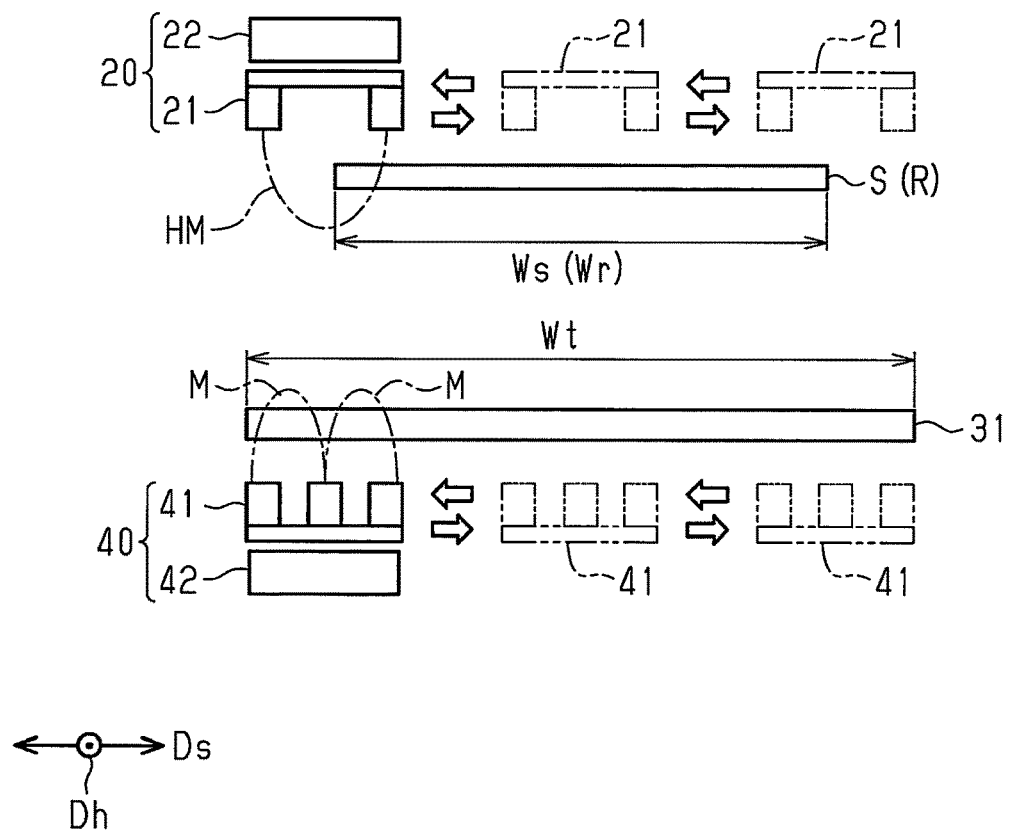
FIG. 3 is a block diagram illustrating oscillation of a first magnetic circuit and oscillation of a second magnetic circuit.

FIG. 3 schematically illustrates the oscillation of the first magnetic circuit 21 and the oscillation of the second magnetic circuit 41. For the sake of brevity, FIG. 3 shows only the first magnetic field formation unit 20, the second magnetic field formation unit 40, the substrate S, and the target 31.

As shown in FIG. 3, the first magnetic field formation unit 20 synchronizes the oscillation of the horizontal magnetic field HM generated by the first magnetic field formation unit 20 with the oscillation of the magnetic field M formed by the second magnetic field formation unit 40. That is, when the second magnetic circuit 41 moves once in the oscillation direction Ds from one end to the other end of the target 31, the first magnetic circuit 21 also moves once in the oscillation direction Ds from one end to the other end of the arrangement region R, that is, from one end to the other end of the substrate S.

The synchronization of the horizontal magnetic field HM formed by the first magnetic field formation unit 20 and the magnetic field M formed by the second magnetic field formation unit 40 regularly changes the position of the horizontal magnetic field HM formed by the first magnetic field formation unit 20 and the position of a high plasma density region formed by the second magnetic field formation unit 40 with respect to the substrate S. Thus, the relationship of the density of the sputtering grains flying toward the substrate S and the strength the horizontal magnetic field HM acting at the position hit by the sputtering grains is maintained in a predetermined state by the synchronized oscillation of the magnetic field formation units 20 and 40. This limits differences in the strength of the horizontal magnetic field HM produced in the plane of the substrate S when the magnetic film is formed.

In addition, the first magnetic field formation unit 20 oscillates the first magnetic circuit 21 so that the first magnetic circuit 21 opposes the second magnetic circuit 41 sandwiching the target 31 and the arrangement region R.

The high plasma density region formed by the second magnetic field formation unit 40 and the region where the horizontal magnetic field HM is formed by the first magnetic field formation unit 20 are overlapped in a direction in which the target 31 and the substrate S are opposed. Thus, the first magnetic field formation unit 20 forms the horizontal magnetic field HM on the substrate S at a position in the oscillation direction Ds where the density of the sputtering grains released from the target 31 is high. Accordingly, the horizontal magnetic field HM formed by the first magnetic field formation unit 20 acts on many portions of the magnetic film formed on the substrate S. This limits differences in the strength of the horizontal magnetic field HM produced in the plane of the substrate S when the magnetic film is formed.

Preferably, the first magnetic circuit 21 is oscillated in the oscillation direction Ds so that it is entirely opposed to the entire second magnetic circuit 41 in the oscillation direction Ds. However, even if the first magnetic circuit 21 is oscillated in the oscillation direction Ds so that it is partially opposed to part of the second magnetic circuit 41 in the oscillation direction Ds, at least the portion of the magnetic film formed in a state opposed to the first magnetic circuit 21 and the second magnetic circuit 41 obtains the effects described above.

The width of the target 31 in the oscillation direction Ds is a target width Wt, and the width of the arrangement region R in the oscillation direction Ds is an arrangement width Wr. The arrangement width Wr is smaller than the target width Wt, and the two ends of the arrangement region R are located inward from the ends of the target 31 in the oscillation direction Ds.

The width of the substrate S in the oscillation direction Ds is the substrate width Ws. The substrate width Ws is equal to the arrangement width Wr. Thus, the substrate width Ws is smaller than the target width Wt, and the two ends of the substrate S are located inward from the ends of the target 31 in the oscillation direction Ds.

In one-dimension coordinates in the oscillation direction Ds, the first magnetic circuit 21 is moved in a range between where one end of the target 31 is located and where the other end of the target 31 is located. In other words, the range where the first magnetic circuit 21 is located in the one-dimensional coordinates in the oscillation direction Ds is larger than the range between where one end of the arrangement region R is located and where the other end of the arrangement region R is located.

In the oscillation direction Ds, the two ends of the range in which the first magnetic circuit 21 moves is where the movement speed of the first magnetic circuit 21 is often decreased or increased. Thus, the magnetic film formed when the first magnetic circuit 21 is moving at a constant speed and the magnetic film formed when the first magnetic circuit 21 is decelerating or accelerating may differ in the strength of the horizontal magnetic field HM acting on the substrate per unit distance and thus may have different magnetic film characteristics.

The first magnetic circuit 21 moves to positions beyond the two ends of the arrangement region R in the oscillation direction Ds. This limits the formation of portions where the strength of the horizontal magnetic field HM per unit distance in the oscillation direction Ds differs from that of other portions in the substrate S because of the deceleration and acceleration of the first magnetic circuit 21. Accordingly, differences are limited in the strength of the horizontal magnetic field HM produced in the plane of the substrate S when the magnetic film is formed. As a result, the magnetic anisotropy in the magnetic film is easily increased.

The first oscillation unit 22 and the second oscillation unit 42 may be formed as described below as long as the first oscillation unit 22 and the second oscillation unit 42 each include the threaded shaft, the nut, and the motor. In the first oscillation unit 22, the width of the threaded shaft in the oscillation direction Ds need only be large enough so that the distal end of the first magnetic circuit 21 in the direction in which the first magnetic circuit 21 is moved can overlap the end of the target 31 located at where the first magnetic circuit 21 is moved to in the direction in which the target 31 and the substrate S are opposed. Thus, the width of the threaded shaft in the oscillation direction Ds is preferably greater than or equal to the target width Wt and further preferably greater than the target width Wt.

In the same manner, with the second oscillation unit 42, the width of the threaded shaft in the oscillation direction Ds need only be large enough so that the distal end of the second magnetic circuit 41 in the direction in which the second magnetic circuit 41 is moved can overlap the end of the target 31 located at where the second magnetic circuit 41 is moved in the direction in which the target 31 and the substrate S are opposed. Thus, the width of the threaded shaft in the oscillation direction Ds is greater than or equal to the target width Wt and further preferably greater than the target width Wt.

Preferably, the rotation speed of the motor in the first oscillation unit 22 is substantially equal to the rotation speed of the motor in the second oscillation unit 42. Thus, preferably, the rotation speed of the threaded shaft in the first oscillation unit 22 is substantially equal to the rotation speed of the threaded shaft in the second oscillation unit 42.

Accordingly, the movement speed of the first magnetic circuit 21 in the oscillation direction Ds is substantially equal to the movement speed of the second magnetic circuit 41 in the oscillation direction Ds.

Further, the rotation direction of the motor in the first oscillation unit 22 is the same as the rotation direction of the motor in the second oscillation unit 42.

The first magnetic circuit 21 is located at a first initial position before oscillation starts, and the second magnetic circuit 41 is located at a second initial position before oscillation starts. Preferably, the first initial position and the second initial position are overlapped in the direction in which the target 31 and the substrate S are opposed.

With the first magnetic field formation unit 20 and the second magnetic field formation unit 40, for example, the controller of the first oscillation unit 22 sends a control signal to the controller of the second oscillation unit 42 at a timing at which the controller of the second oscillation unit 42 sends a control signal to the motor. Further, the controller of the first oscillation unit 22 and the controller of the second oscillation unit 42 send control signals to the power sources at the same timing to oscillate the first magnetic circuit 21 and the second magnetic circuit 41 in a state opposed to each other in the direction in which the target 31 and the substrate S are opposed.

Figure 4:
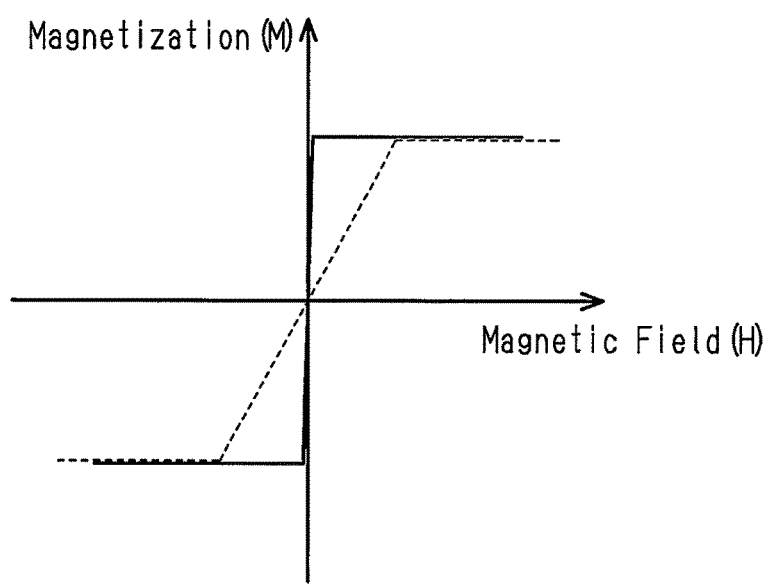
FIG. 4 is a graph illustrating a magnetization curve of a magnetic film.

FIG. 4 shows a magnetization curve of the magnetic film. In FIG. 4, the magnetic film of an example is formed in a state in which a magnetic field is applied by the first magnetic circuit 21, and the magnetic film of a comparative example is formed in a state in which a magnetic field is not applied by the first magnetic circuit 21. In FIG. 4, the solid lines indicate the magnetization curve obtained when a magnetic field in a direction parallel to the magnetization easy axis is applied to the example, and the broken lines indicate the magnetization curve obtained when a magnetic field in a direction parallel to the magnetization easy axis is applied to the comparative example.

As shown in FIG. 4, when the strength of the magnetic field applied to the magnetic film changes, the magnetization of the magnetic film steeply changes from negative saturation magnetization to positive saturation magnetization in the magnetic film of the example, whereas the magnetization of the magnetic film gradually changes from negative saturation magnetization to positive saturation magnetization in the magnetic film of the comparative example. In other words, the difference in magnetic field needed to reverse negative saturation magnetization to positive saturation magnetization is relatively small in the magnetic film of the example, whereas the difference in magnetic field needed to reverse negative saturation magnetization to positive saturation magnetization is relatively large in the magnetic film of the comparative example.

In this manner, the film formation apparatus 10 can form a magnetic film in which the difference in magnetic field needed to reverse negative saturation magnetization to positive saturation magnetization is smaller, that is, a magnetic film of which the magnetic anisotropy is increased.

As described above, it is preferred that the strength of the magnetic flux density at the first magnetic circuit 21 be greater than or equal to 1 G in order to increase the magnetic anisotropy of the magnetic film. The magnetic anisotropy of the magnetic film increases as the magnetic flux density increases.

The first magnetic circuit 21 and the second magnetic circuit 41 are oscillated sandwiching the target 31 and the substrate S in the direction in which the target 31 and the substrate S are opposed. This oscillates the horizontal magnetic field HM formed by the first magnetic circuit 21 and the magnetic field M formed at the second magnetic circuit 41 opposing each other at opposite sides of the target 31 and the substrate S.

Thus, when the magnetic flux density of the horizontal magnetic field HM formed by the first magnetic circuit 21 increases, the horizontal magnetic field HM interferes with the magnetic field M formed by the second magnetic circuit 41 and affects the state of the plasma formed around the surface of the target 31 opposed to the substrate S.

Figure 5:
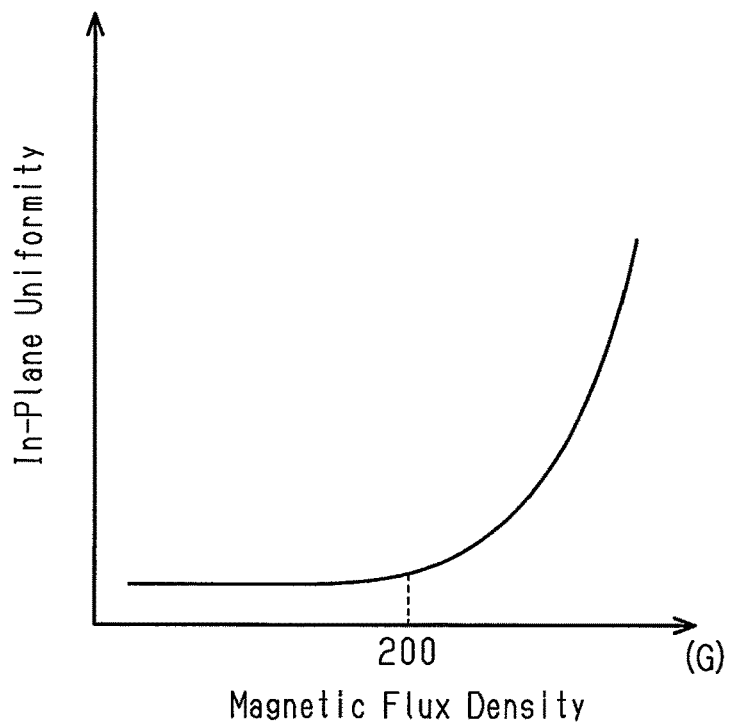
FIG. 5 is a graph illustrating the relationship of the magnetic flux density in a horizontal magnetic field formed by the first magnetic circuit and the in-plane uniformity in a magnetic film.

FIG. 5 shows the relationship of the magnetic flux density of the first magnetic circuit 21 at the surface of the substrate S opposing the target 31 and the uniformity in a plane of the thickness of magnetic film formed on the substrate S. FIG. 5 shows the in-plane uniformity of the thickness of the magnetic film when the magnetic flux density of the second magnetic circuit 41 is 200 G. Further, the in-plane uniformity of the thickness of the magnetic film is calculated by measuring the thickness of the magnetic film at a number of locations and substituting the maximum value Max and the minimum value min of the thickness in equation (1), which is shown below.

$$(\text{in-plane uniformity}) = (\text{Max}-\text{min})/(\text{Max}+\text{min}) \times 100\ (\%) \qquad \text{equation (1)}$$

As shown in FIG. 5, the in-plane uniformity of the thickness of the magnetic film greatly decreases when the magnetic flux density of the first magnetic circuit 21 exceeds 200 G as compared with when the magnetic flux density of the first magnetic circuit 21 is 200 G or less. In other words, when the magnetic flux density of the first magnetic circuit 21 exceeds the magnetic flux density of the second magnetic circuit 41, the in-plane uniformity in the thickness of the magnetic film greatly decreases.

In this manner, when the magnetic flux density of the first magnetic circuit 21 exceeds the magnetic flux density of the second magnetic circuit 41, the amount the horizontal magnetic field HM interferes with the magnetic field M affects the state of the plasma formed around the surface opposing the substrate S and increases to a level that decreases the in-plane uniformity of the thickness of magnetic film.

Accordingly, it is preferred that the strength of the magnetic flux density in the horizontal magnetic field HM be 1 G or greater and less than or equal to the magnetic flux density of the second magnetic circuit 41. The inclusion of the magnetic flux density of the first magnetic circuit 21 in such a range increases the magnetic anisotropy of the magnetic film and limits decreases the in-plane uniformity of the thickness of the magnetic film.

Figure 6:
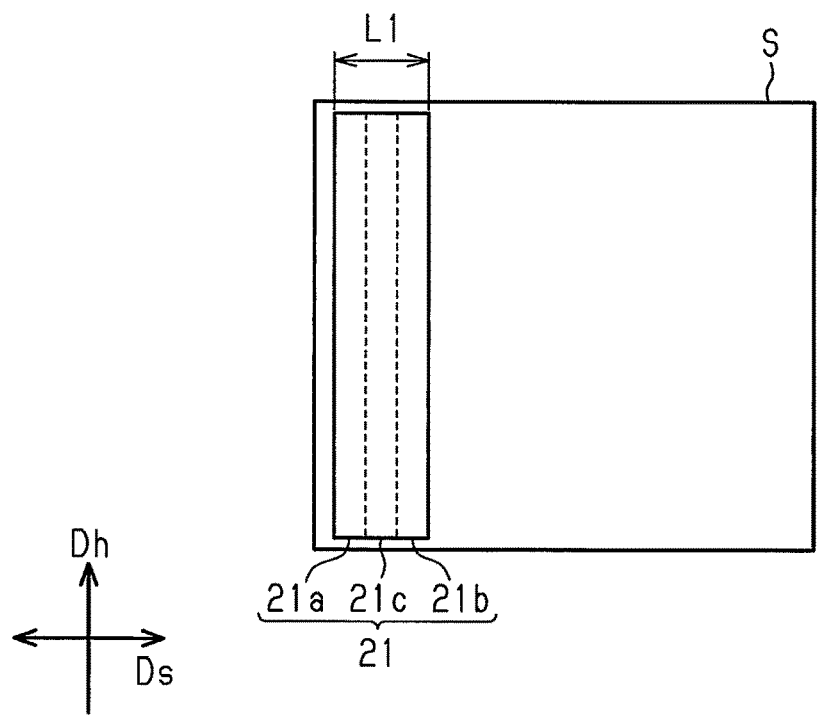
FIG. 6 is a plan view showing a substrate and the first magnetic circuit in a plan view opposing a rear surface of the substrate.

As shown in FIG. 6, in a plan view of the surface of the substrate S opposing the first magnetic circuit 21, the first magnetic circuit 21 has the first width L1 in the oscillation direction Ds and a length in the height-wise direction Dh that is substantially the same as that of the substrate S. Preferably, the first width L1 of the first magnetic circuit 21 is large enough to form the horizontal magnetic field HM parallel to the oscillation direction Ds on the surface of the substrate S that opposes the target 31 and small enough to avoid a situation in which the strength of the magnetic field formed by the first magnetic circuit 21 is fixed in the plane of the substrate S.

Figure 7:
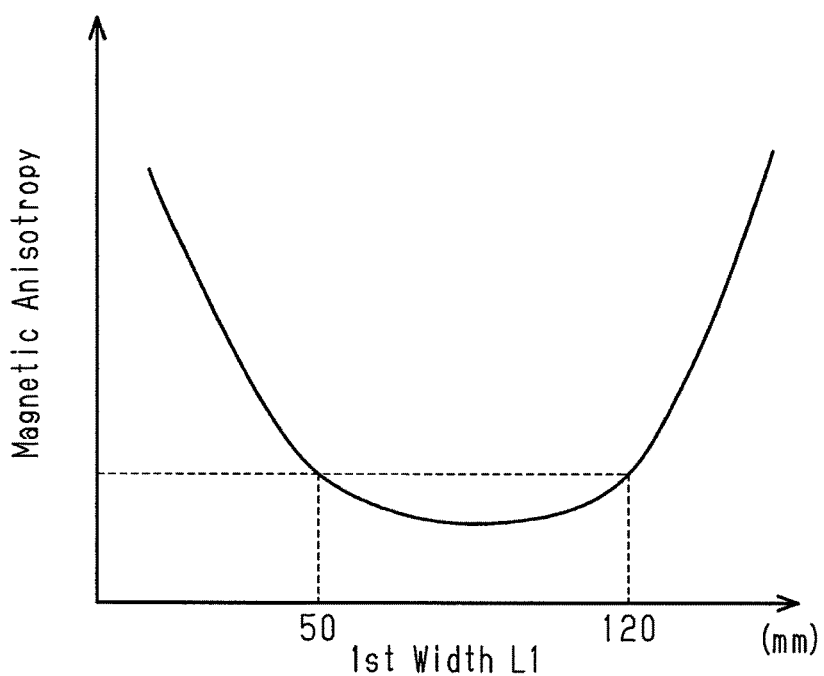
FIG. 7 is a graph illustrating the relationship of a first width in the first magnetic circuit and the magnetic anisotropy in the magnetic film.

FIG. 7 is a graph showing the relationship of the first width L1 of the first magnetic circuit 21 and the magnetic anisotropy. FIG. 7 shows the magnetic anisotropy as the difference in the magnetic field needed to reverse the magnetization of the magnetic film from negative saturation magnetization to positive saturation magnetization. Further, FIG. 7 shows the relationship of the first width L1 and the magnetic anisotropy when the substrate width Ws is 120 mm.

As shown in FIG. 7, when the first width L1 is 50 mm or greater and 120 mm or less, the magnetic anisotropy of the magnetic anisotropy has a further preferable value. Further, when the first width L1 is in the range of 50 mm or greater to 120 mm or less, the magnetic anisotropy of the magnetic film has a minimum value.

If the first width L1 is 50 mm or greater, as viewed in a direction in which the substrate S and the first magnetic circuit 21 are opposed, the area of the substrate S occupied by the horizontal magnetic field HM formed by the first magnetic circuit 21 increases to a level ensuring that the magnetic anisotropy of the magnetic film is increased. If the first width L1 is 120 mm or less, the distribution of the strength of the magnetic field formed by the horizontal magnetic field HM is not easily fixed in the plane of the substrate S.

Even when the first width L1 is smaller than 50 mm or larger than 120 mm, as long as a magnetic field is applied to the substrate S when a magnetic film is formed, the magnetic anisotropy of the magnetic film can be increased to a certain extent in contrast with a configuration in which a magnetic field is not applied to the substrate S.

[Film Formation Method]

A film formation method will now be described with reference to FIG. 8.

The film formation method includes sputtering the target 31 that contains a magnetic material. Further, while the target 31 is being sputtered, the film formation method oscillates the horizontal magnetic field HM formed parallel to the oscillation direction Ds on the substrate S at the side where the target 31 is located at least between one end and the other end of the substrate S in the oscillation direction Ds along the substrate S, which opposes the target 31.

Figure 8:
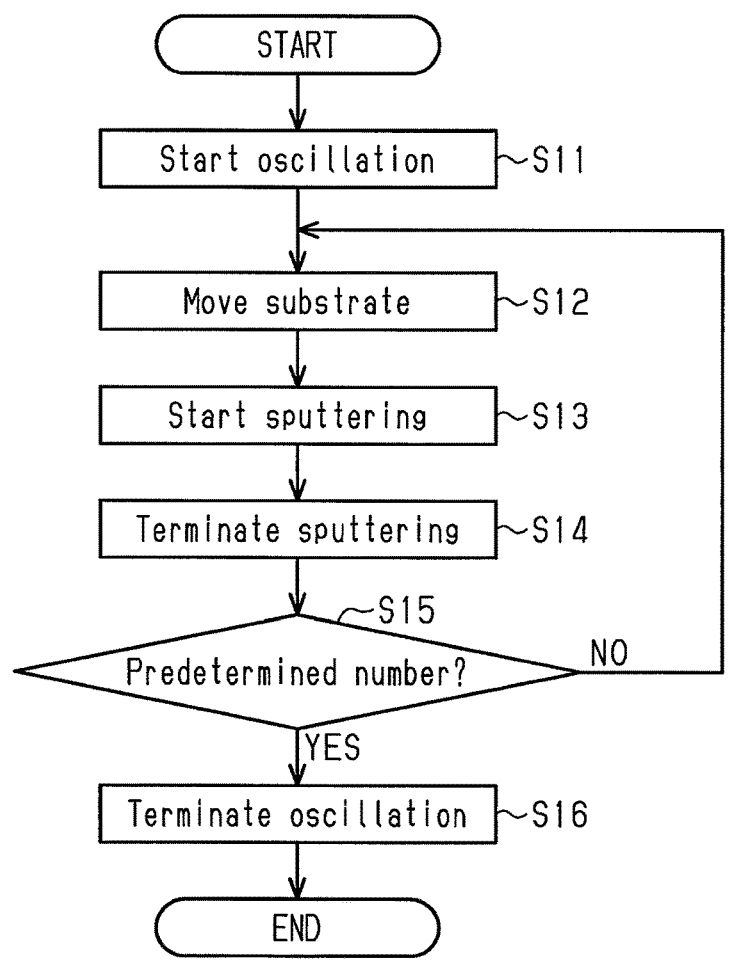
FIG. 8 is a flowchart illustrating processing procedures in one embodiment of a film formation method according to the present invention.

As shown in FIG. 8, the film formation method first starts to oscillate the first magnetic circuit 21 of the first magnetic field formation unit 20 and the second magnetic circuit 41 of the second magnetic field formation unit 40 (step S11). Then, the substrate S is moved together with the tray T in the film formation chamber 12 to a position opposed to the target 31 (step S12). Here, in one-dimensional coordinates in the oscillation direction Ds, the range in which the first magnetic circuit 21 is moved is between a position at one end of the target 31 and a position at the other end of the target 31. Thus, the first magnetic circuit 21 forms the horizontal magnetic field HM parallel to the oscillation direction Ds on the surface of the substrate S opposing the target 31.

Then, sputtering of the target 31 is started (step S13). Here, the gas supply unit 52 supplies the film formation chamber 12 with sputter gas, and the electric power supply 51 then applies voltage via the backing plate 32 to the target 31. This generates plasma in the film formation chamber 12, and the positive ions in the plasma are pulled toward the target 31 to sputter the target 31. The target 31 is sputtered until a magnetic film formed on the surface of the substrate S opposing the target 31 has, for example, a thickness of approximately 1 µm.

When the magnetic film is formed with a predetermined thickness on the substrate S, the sputtering of the target 31 is terminated (step S14). The processes of steps S12 to S14 are repeated until forming the magnetic film on a predetermined number of substrates S (step S15: NO). When the predetermined number of substrates S is formed (step S15: YES), the oscillation of the first magnetic circuit 21 and the second magnetic circuit 41 is terminated (step S16).

The embodiment of the film formation apparatus and the film formation method has the advantages described below.

(1) The horizontal magnetic field HM having a predetermined strength scans the plane of the substrate S in the oscillation direction Ds. Thus, when a magnetic film is formed on the substrate S, differences in the strength of the horizontal magnetic field HM are obviated from becoming uniform in the plane of the substrate S. Further, differences in the strength of the horizontal magnetic field HM are limited when each portion of the magnetic film is formed. This increases the magnetic anisotropy of the magnetic film.

(2) The oscillation of the horizontal magnetic field HM formed by the first magnetic field formation unit 20 is synchronized with the oscillation of the magnetic field M formed by the second magnetic field formation unit 40. This regularly changes the positions relative to the substrate S of the horizontal magnetic field HM formed by the first magnetic field formation unit 20 and the high plasma density region formed by the second magnetic field formation unit 40. Accordingly, the relationship of the density of the sputtering grains flying toward the substrate S and the strength of the horizontal magnetic field HM acting at the position hit by the sputtering grains is maintained in a predetermined state by the synchronized oscillation of the magnetic field formation units 20 and 40. This limits differences in the strength of the horizontal magnetic field HM produced in the plane of the substrate S when the magnetic film is formed.

(3) The high plasma density region formed by the second magnetic field formation unit 40 and the region where the horizontal magnetic field HM is formed by the first magnetic field formation unit 20 are overlapped in a direction in which the target 31 and the substrate S are opposed. Thus, the first magnetic field formation unit 20 forms the horizontal magnetic field HM on the substrate S at a position in the oscillation direction Ds where the density of the sputtering grains released from the target 31 is high. Accordingly, the horizontal magnetic field HM formed by the first magnetic field formation unit 20 acts on many portions of the magnetic film formed on the substrate S. This limits differences in the strength of the horizontal magnetic field HM produced in the plane of the substrate S when the magnetic film is formed.

(4) The first magnetic circuit 21 moves to positions beyond the two ends of the arrangement region R in the oscillation direction Ds. This limits the formation of portions where the strength of the horizontal magnetic field HM per unit distance in the oscillation direction Ds differs from that of other portions in the substrate S because of the deceleration and acceleration of the first magnetic circuit 21. Accordingly, differences are limited in the strength of the horizontal magnetic field HM produced in the plane of the substrate S when the magnetic film is formed. As a result, the magnetic anisotropy in the magnetic film is easily increased.

(5) The first magnetic circuit 21 includes a pair of permanent magnets. Thus, the horizontal magnetic field HM formed between the two permanent magnets scans the entire substrate S. Accordingly, in comparison with a structure in which a magnetic field formation unit including multiple pairs of permanent magnets scans the substrate S, the difference in magnetic field direction, between the magnetic fields formed by the pairs of permanent magnets, and the distribution of the magnetic field strength, in the plane of the substrate S, are limited. As a result, the magnetic anisotropy of the magnetic film is further increased.

The embodiment described above may be modified as described below.

The first magnetic circuit 21 may be configured in the same manner as the second magnetic circuit 41. More specifically, the first magnetic circuit 21 may include a pillar-shaped first magnet extending in the height-wise direction Dh, an annular second magnet surrounding the first magnet, and a yoke to which the first magnet and the second magnet are fixed. In such a configuration, the first magnetic field formation unit 20 also forms the horizontal magnetic field HM parallel to the oscillation direction Ds and oscillates in the oscillation direction Ds. Thus, advantage (1) is obtained.

The first magnetic circuit 21 may oscillate in the oscillation direction Ds from one end to the other end of the substrate S. In such a configuration, the first magnetic circuit 21 also forms the horizontal magnetic field HM parallel to the oscillation direction Ds and oscillates in the oscillation direction Ds. Thus, advantage (1) is obtained.

Only one end of the substrate S in the oscillation direction Ds may be located inward from an end of the target 31. Even in such a configuration, as long as the first magnetic circuit 21 oscillates beyond a portion at the end of the substrate S located inward from the end of the target 31, the portion located inward from the end of the target 31 obtains advantage (4).

The movement range of the first magnetic circuit 21 may include a range between the position of one end of the target 31 and the position of the other end of the target 31 in one-dimensional coordinates in the oscillation direction Ds. For example, the first magnetic circuit 21 may move relative to the target 31 between a position located outward from one end of the target 31 and a position located outward from the other end of the target 31. Even in such a configuration, the first magnetic circuit 21 moves to positions beyond the two ends of the arrangement region R in the oscillation direction Ds. Thus, advantage (4) is obtained.

In the oscillation direction Ds, the target width Wt may be less than or equal to the substrate width Ws. Even in such a configuration, the first magnetic field formation unit 20 forms the horizontal magnetic field HM parallel to the oscillation direction Ds and oscillates the horizontal magnetic field HM in the oscillation direction Ds. Thus, advantage (1) is obtained.

As long as the oscillation of the first magnetic circuit 21 is synchronized with the oscillation of the second magnetic circuit 41, the first magnetic circuit 21 does not have to be opposed to the second magnetic circuit 41 when oscillated. In other words, the oscillation cycle of the first magnetic circuit 21 may differ from the oscillation cycle of the second magnetic circuit 41 in a manner that the ratio of the oscillation cycle of the first magnetic circuit 21 and the oscillation cycle of the second magnetic circuit 41 is a constant value.

For example, while the first magnetic circuit 21 performs scanning once in the oscillation direction Ds, the second magnetic circuit 41 may perform scanning twice in the oscillation direction Ds. Alternatively, while the first magnetic circuit 21 performs scanning twice in the oscillation direction Ds, the second magnetic circuit 41 may perform scanning once in the oscillation direction Ds. In this manner, while the first magnetic circuit 21 performs scanning an m number of times in the oscillation direction Ds, the second magnetic circuit 41 may perform scanning an n number of times in the oscillation direction Ds, where n and m are different integers.

In such a configuration, the oscillation of the first magnetic circuit 21 is synchronized with the oscillation of the second magnetic circuit 41. Thus, advantage (2) is obtained.

The oscillation of the first magnetic circuit 21 does not have to be synchronized with the oscillation of the second magnetic circuit 41. Even in such a configuration, the first magnetic field formation unit 20 forms the horizontal magnetic field HM parallel to the oscillation direction Ds and oscillates in the oscillation direction Ds. Thus, advantage (1) is obtained.

The first oscillation unit 22 and the second oscillation unit 42 may each include a power source and a transmission, and the first oscillation unit 22 and the second oscillation unit 42 may share a common control unit. In such a configuration, the control unit need only provide the power source of the first oscillation unit 22 and the power source of the second oscillation unit 42 with a control signal that synchronizes the driving of the two power sources.

The first oscillation unit 22 and the second oscillation unit 42 may each include a transmission, and the first oscillation unit 22 and the second oscillation unit 42 may share a common power source. In such a configuration, the oscillation of the first magnetic circuit 21 and the oscillation of the second magnetic circuit 41 are synchronized by driving the power source.

The first oscillation unit 22 may be configured to include the transmission and the power source, and the second oscillation unit 42 may be configured to include a transmission that is coupled to the transmission of the first oscillation unit 22. In such a configuration, the oscillation of the first magnetic circuit 21 and the oscillation of the second magnetic circuit 41 are synchronized by driving the power source of the first oscillation unit 22.

The second magnetic field formation unit 40 does not have to include the second oscillation unit 42. In such a configuration, the second magnetic circuit 41 need only be configured so that a magnetic field is formed on substantially the entire surface of the target 31 opposing the arrangement region R. Alternatively, instead of the second oscillation unit 42, the second magnetic field formation unit 40 may include a rotation mechanism that rotates the second magnetic circuit 41 relative to a rotation shaft that is parallel to the direction of a normal to the target 31. As another option, the film formation apparatus 10 does not have to include the second magnetic circuit 41.

The first width L1 and the second width L2 may be different dimensions. The first width L1 may be smaller than the second width L2 or larger than the second width L2.

The support is not limited to the transportation unit 14, which is described above, and may be, for example, a substrate stage that supports the substrate S in a state opposing the target 31. In such a configuration, the film formation apparatus 10 includes a transportation unit that is separate from the support and transports the substrate S to the support from a position in the film formation apparatus 10 separated from the support.

The support may be configured to support the substrate S in a state in which the direction of a normal to the surface of the substrate S opposing the target 31 intersects the direction of a normal of the surface of the target 31 opposing the substrate S. For example, in a state in which the support supports the substrate S in the horizontal direction and the target 31 is held at a predetermined inclination relative to the horizontal direction, the support may be positioned to oppose the substrate S. In such a configuration, advantage (1) is obtained as long as the film formation apparatus 10 includes the first magnetic field formation unit 20 that oscillates the horizontal magnetic field HM between one end and the other end of the arrangement region R in the oscillation direction Ds.

The invention claimed is:

1. A magnetic film formation apparatus comprising:
a target containing a magnetic material;
a support that supports a substrate and locates the substrate in an arrangement region opposing the target;
a first magnetic field formation unit located at a side of the arrangement region opposite to the target, wherein the first magnetic field formation unit forms a horizontal magnetic field parallel to an oscillation direction, which is one direction extending along the substrate, at a side of the arrangement region where the target is located, and the first magnetic field formation unit oscillates the horizontal magnetic field in the oscillation direction at least between one end of the arrangement region and another end of the arrangement region in the oscillation direction; and
a second magnetic field formation unit located at a side of the target opposite to the support, wherein the second magnetic field formation unit oscillates in the oscillation direction between one end of the target and another end of the target in the oscillation direction and forms a magnetic field at a side of the target where the support is located,
wherein the first magnetic field formation unit's horizontal magnetic field is formed by only a pair of permanent magnets wherein a magnetic pole at a distal end of one of the permanent magnets and a magnetic pole at a distal end of the other one of the permanent magnets are different magnetic poles, and
wherein the first magnetic field formation unit has a first width in the oscillation direction, the second magnetic field formation unit has a second width in the oscillation direction, and the second width is equal to the first width.

2. The magnetic film formation apparatus according to claim 1,
wherein the first magnetic field formation unit includes a controller that synchronizes oscillation of the magnetic field formed by the second magnetic field formation unit and oscillation of the horizontal magnetic field formed by the first magnetic field formation unit so that the first magnetic field formation unit is opposed to the second magnetic field formation unit.

3. The magnetic film formation apparatus according to claim 1, wherein:
the first magnetic field formation unit includes a first magnetic circuit that forms the horizontal magnetic field,
the second magnetic field formation unit includes a second magnetic circuit that forms the magnetic field, and
the first magnetic field formation unit oscillates the first magnetic circuit so that the first magnetic circuit and the second magnetic circuit are opposed sandwiching the target and the arrangement region.

4. The magnetic film formation apparatus according to claim 3, wherein:
the target has a width in the oscillation direction as a target width;
the arrangement region has a width in the oscillation direction as an arrangement width, wherein the arrangement width is smaller than the target width, and the two ends of the arrangement region are located inward from the ends of the target in the oscillation direction;
a range in which the first magnetic circuit moves in the oscillation direction with respect to one dimensional coordinates includes a range sandwiched by a position at the one end of the target and a position at the other end of the target.

5. The magnetic film formation apparatus according to claim 1, wherein each of the permanent magnets is pillar-shaped and extends in a direction intersecting the oscillation direction.

6. A magnetic film formation method comprising:
sputtering a target that contains magnetic material;
forming, by a first magnetic field formation unit, a horizontal magnetic field parallel to an oscillation direction, which is one direction extending along a substrate opposing the target, on the substrate at a side where the target is located so that the horizontal magnetic field oscillates at least between one end of the substrate and another end of the substrate in the oscillation direction while the target is being sputtered; and
forming, by a second magnetic field formation unit, a magnetic field on the target opposing the substrate, wherein the second magnetic field formation unit oscillates in the oscillation direction between one end of the target and another end of the target in the oscillation direction,
wherein the horizontal magnetic field is formed by only a pair of permanent magnets, wherein a magnetic pole at a distal end of one of the permanent magnets and a magnetic pole at a distal end of the other one of the permanent magnets are different magnetic poles, and
wherein the first magnetic field formation unit has a first width in the oscillation direction, the second magnetic field formation unit has a second width in the oscillation direction, and the second width is equal to the first width.

* * * * *